US008829999B2

(12) United States Patent
Fisher (10) Patent No.: US 8,829,999 B2
(45) Date of Patent: Sep. 9, 2014

(54) LOW NOISE AMPLIFIERS INCLUDING GROUP III NITRIDE BASED HIGH ELECTRON MOBILITY TRANSISTORS (75) Inventor: Jeremy Fisher, Raleigh, NC (US)

(73) Assignee: Cree, Inc., Durham, NC (US)

(*) Notice: Subject to any disclaimer, the term of this patent is extended or adjusted under 35 U.S.C. 154(b) by 0 days.

(21) Appl. No.: 13/110,584

(22) Filed: May 18, 2011

(65) Prior Publication Data
US 2012/0194276 A1 Aug. 2, 2012

Related U.S. Application Data (60) Provisional application No. 61/346,757, filed on May 20, 2010.

(51) Int. Cl.
H03F 1/14 (2006.01)
H03F 3/68 (2006.01)
H01L 27/085 (2006.01)
H01L 29/40 (2006.01)
H01L 29/778 (2006.01)
H01L 27/06 (2006.01)
H03F 3/195 (2006.01)
H01L 29/423 (2006.01)
H01L 29/20 (2006.01)

(52) U.S. Cl.
CPC ...... H01L 27/0605 (2013.01); H03F 2200/492 (2013.01); H03F 2200/318 (2013.01); H01L 29/42316 (2013.01); H01L 27/085 (2013.01); H03F 2200/54 (2013.01); H01L 29/402 (2013.01); H01L 29/2003 (2013.01); H01L 29/7786 (2013.01); H03F 2200/411 (2013.01); H03F 2200/108 (2013.01); H03F 3/195 (2013.01)
USPC .......................................... 330/307; 330/310

(58) Field of Classification Search
USPC ................................. 330/302, 307, 310, 133
See application file for complete search history.

(56) References Cited

U.S. PATENT DOCUMENTS

| 5,290,393 A | 3/1994 | Nakamura |
| 5,393,993 A | 2/1995 | Edmond et al. |
| 5,523,589 A | 6/1996 | Edmond et al. |
| 5,686,738 A | 11/1997 | Moustakas |

(Continued)

FOREIGN PATENT DOCUMENTS

| JP | 2003-297924 A | 10/2003 |
| JP | 2004-248252 A | 9/2004 |

(Continued)

OTHER PUBLICATIONS

Japanese Office Action Corresponding to Japanese Patent Application No. 2011-113609; Mailing Date: Jun. 12, 2012; Foreign Text, 3 pages, English Translation Thereof, 3 Pages.

(Continued)

Primary Examiner — Steven J Mottola
(74) Attorney, Agent, or Firm — Myers Bigel Sibley & bSajovec, P.A.

(57) ABSTRACT

A low noise amplifier includes a first Group III-nitride based transistor and a second Group III-nitride based transistor coupled to the first Group III-nitride based transistor. The first Group III-nitride based transistor is configured to provide a first stage of amplification to an input signal, and the second Group III-nitride based transistor is configured to provide a second stage of amplification to the input signal.

19 Claims, 5 Drawing Sheets

(56) References Cited

U.S. PATENT DOCUMENTS

| | | | |
|---|---|---|---|
| 5,739,554 | A | 4/1998 | Edmond et al. |
| 6,316,793 | B1 | 11/2001 | Sheppard et al. |
| 6,548,333 | B2 | 4/2003 | Smith |
| 6,586,781 | B2 | 7/2003 | Wu et al. |
| 6,603,351 | B2 * | 8/2003 | Suzuki .................. 330/133 |
| 6,849,882 | B2 | 2/2005 | Chavarkar et al. |
| 7,126,426 | B2 | 10/2006 | Mishra et al. |
| 7,230,284 | B2 | 6/2007 | Parikh et al. |
| 7,477,102 | B1 * | 1/2009 | Ellis et al. .................. 330/133 |
| 7,501,669 | B2 | 3/2009 | Parikh et al. |
| 7,550,783 | B2 | 6/2009 | Wu et al. |
| 7,573,078 | B2 | 8/2009 | Wu et al. |
| 7,795,672 | B2 * | 9/2010 | Koudymov et al. .......... 257/331 |
| 2002/0167023 | A1 | 11/2002 | Chavarkar et al. |
| 2003/0020092 | A1 | 1/2003 | Parikh et al. |
| 2005/0051800 | A1 | 3/2005 | Mishra et al. |
| 2006/0202272 | A1 | 9/2006 | Wu et al. |
| 2007/0018210 | A1 | 1/2007 | Sheppard |
| 2007/0059873 | A1 | 3/2007 | Chini et al. |

FOREIGN PATENT DOCUMENTS

| | | | |
|---|---|---|---|
| JP | 2006-114795 | A | 4/2006 |
| JP | 2008-533717 | A | 8/2008 |
| JP | 2009-514267 | A | 4/2009 |
| JP | 2010-057025 | A | 3/2010 |
| WO | WO 2006/050403 | | 5/2006 |
| WO | WO 2006/098801 | A1 | 9/2006 |
| WO | WO 2009/035767 | A1 | 3/2009 |

OTHER PUBLICATIONS

Japanese Decision of Rejection Corresponding to Japanese Patent Application No. 2011-113609; Mailing Date: Dec. 7, 2012; 3 Pages (Foreign Text Only).

Japanese Office Action Corresponding to Japanese Patent Application No. 2011-113609; Mailing Date: May 28, 2013; 3 Pages (Foreign Text Only).

Bettidi, et al.; *X-Band GaN-HEMT LNA Performance Versus Robustness Trade-Off*, Proceedings of the 39th European Microwave Conference, 2009 IEEE, Sep. 29-Oct. 1, 2009, Rome, Italy; pp. 1792-1795.

Rudolph, et al.; *Analysis of the Survivability of GaN Low-Noise Amplifiers*, IEEE Transactions on Microwave Theory and Techniques, vol. 55, No. 1; Jan. 2007; pp. 37-43.

Rudolph et al.; *Highly Robust X-Band LNA with Extremely Short Recover Time*; 2009 IEEE, Microwave Symposium Digest, Jun. 7, 2009, pp. 781-784.

Kobayashi et al.; *A 2 Watt, Sub-dB Noise Figure GaN MMIC LNA-PA Amplifier with Multi-octave Bandwidth from 0.2-8 GHz, 2007*; Microwave Symposium 2007, IEEE International, Jun. 2007; pp. 619-622.

Aust et al., *Wideband Dual-Gate GaN HEMT Low Noise Amplifier for Front-End Receiver Electronics*; Compound Semiconductor Integrated Circuit Symposium, 2006 IEEE, Nov. 2006, pp. 89-92.

European Search Report Corresponding to European Patent Application No. 11 16 6756; Mailing Date: Dec. 17, 2013; 10 Pages.

* cited by examiner

LOW NOISE AMPLIFIERS INCLUDING GROUP III NITRIDE BASED HIGH ELECTRON MOBILITY TRANSISTORS

CROSS REFERENCE TO RELATED APPLICATION

The present application claims the benefit of and priority to U.S. Provisional Patent Application No. 61/346,757, filed May 20, 2010, entitled "LOW NOISE AMPLIFIERS INCLUDING GALLIUM NITRIDE HIGH ELECTRON MOBILITY TRANSISTORS," the disclosure of which is hereby incorporated herein by reference in its entirety.

STATEMENT OF U.S. GOVERNMENT INTEREST

This invention was made with Government support under Contract No. 1138 05-D-6000 awarded by The U.S. Department of Defense. The Government has certain rights in the invention.

TECHNICAL FIELD

The present invention relates to amplifiers, and in particular to low noise amplifiers.

BACKGROUND

Low noise amplifiers (LNAs) are used in a variety of applications. In particular, LNAs are used in the receiver front end of a wireless communication device to amplify a received RF signal, such as receiver front ends in communications, radar, and other RF systems.

For example, LNAs may be used in an S-band RF module or receiver, base stations for cellular communications including derivative applications (e.g. 3G, 4G, WiFi, WiMax, and digital broadcast receivers) and receivers and modules for radar applications.

In general, it is desirable for an LNA to operate with high linearity and input power survivability. Furthermore, it may be desirable to be able to integrate an LNA into a high voltage system.

SUMMARY

A monolithic microwave integrated circuit low noise amplifier according to some embodiments includes a substrate and an input port on the substrate for receiving an input signal to be amplified. A first Group III-nitride based transistor is on the substrate and is coupled to the input port. The first Group III-nitride based transistor is configured to provide a first stage of amplification to the input signal. A second Group III-nitride based transistor is on the substrate and is coupled to the first Group III-nitride based transistor. The second Group III-nitride based transistor is configured to provide a second stage of amplification to the input signal. The amplifier further includes an output port on the substrate and coupled to the second Group III-nitride based transistor.

The first and second Group III-nitride based transistors may include Group III-nitride based high electron mobility transistors.

At least one of the first and second Group III-nitride based transistors may include a field plate. The field plate may be conductively connected to a source terminal of the at least one transistor. In some embodiments, the field plate may be conductively connected to a gate terminal of the at least one transistor.

The transistor may further include a second field plate that may be electrically isolated from the first field plate. The second field plate may be conductively connected to a source terminal of the at least one transistor.

The monolithic microwave integrated circuit low noise amplifier may further include an input network coupled between the input port and the first Group III-nitride based transistor, an interstage network coupled between the first Group III-nitride based transistor and the second Group III-nitride based transistor, and an output network coupled between the second Group III-nitride based transistor and the output port.

The monolithic microwave integrated circuit low noise amplifier may further include a first gate bias port coupled to a gate of the first Group III-nitride based transistor, a first drain bias port coupled to a drain of the first Group III-nitride based transistor, a second gate bias port coupled to a gate of the second Group III-nitride based transistor, and a second drain bias port coupled to a drain of the second Group III-nitride based transistor.

The first Group III-nitride transistor may have a gate periphery less than about 1 mm, and the second Group III-nitride transistor may have a gate periphery greater than about 1 mm.

The first Group III-nitride transistor may have a gate periphery of about 0.72 mm, and the second Group III-nitride transistor may have a gate periphery of about 1.2 mm.

The amplifier may have a third order intercept greater than 25 dBm at a frequency that is in the range of 2.6 GHz to 3.95 GHz. Moreover, the amplifier may have a noise figure less than 3.0 dB at a frequency that is in the range of 2.6 GHz to 3.95 GHz.

A low noise amplifier according to some embodiments includes a first Group III-nitride based transistor and a second Group III-nitride based transistor coupled to the first Group III-nitride based transistor. The first Group III-nitride based transistor is configured to provide a first stage of amplification to an input signal, and the second Group III-nitride based transistor is configured to provide a second stage of amplification to the input signal.

Some embodiments provide a package including a monolithic microwave integrated circuit low noise amplifier as described herein. The package may have a footprint not greater than 0.5 inches square.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DESCRIPTION OF EMBODIMENTS

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Some embodiments provide a 2-stage Low Noise Amplifier (LNA) formed as a monolithic microwave integrated circuit (MMIC) employing Group III-nitride based High Electron Mobility Transistors (HEMTs). By incorporating Group III-nitride based HEMTs, circuits/devices according to some embodiments can achieve a noise figure less than 3.0 dB and/or an output TOI (Third Order Intercept) higher than 25 dB over a frequency range from 2.3 to 4.5 GHz. In some embodiments, devices according to some embodiments can achieve a noise figure less than 2.0 dB and/or an output TOI (Third Order Intercept) higher than 35 dB over a frequency range from 2.6 to 3.95 GHz. In some further embodiments, devices according to some embodiments can achieve a noise figure less than 2.0 dB and/or an output TOI (Third Order Intercept) higher than 35 dB over a frequency range from 3.0 to 3.5 GHz. In some embodiments, devices according to some embodiments can achieve a noise figure less than 1.75 dB at a frequency greater than 2.5 GHz. In some further embodiments, devices according to some embodiments can achieve an output TOI (Third Order Intercept) higher than 38 dB over a frequency range from 2.5 to 3.75 GHz.

Group III nitrides refer to those semiconductor compounds formed between nitrogen and the elements in the Group III of the periodic table, usually aluminum (Al), gallium (Ga), and/or indium (In). The term also refers to ternary and quaternary compounds, such as AlGaN and AlInGaN. For simplicity, Group III-nitride based structures will be referred to herein as "GaN-based" structures.

GaN-based HEMTs are not conventionally considered good choices to use as transistors in low noise amplifiers, because GaN transistors do not generally have good noise characteristics. For example, GaN has poorer noise characteristics than other semiconductor materials, such as GaAs and/or InP that are conventionally used in high frequency low noise amplifiers. However, transistors formed using those materials may not have as high input power survivability as GaN-based transistors. Therefore, it would be desirable to make a low noise amplifier using GaN-based transistors provided the noise figure of the GaN-based low noise amplifier could be limited to an acceptable amount.

In some embodiments, a low noise amplifier including GaN-based HENTs can achieve a low noise figure while simultaneously achieving high Third Order Intercept (TOI) characteristics, high P1dB characteristics, and/or high input power survivability. In practice, circuits/devices according to embodiments of the invention can be scaled to achieve higher TOI, or can be tuned to accommodate other frequency bands.

The use of GaN-based HEMTs in an LNA according to some embodiments provides good noise figure performance while also providing superior TOI and saturated power than is available through other material technologies. This may lead to a higher dynamic range for easier system integration. The GaN-based HEMTs may also have better input power survivability, allowing them to be integrated with less need for input protection circuitry, which may improve overall system performance. Because GaN-based HEMTs have higher breakdown voltages and are typically biased at higher voltages than transistors formed using other material technologies, they can be used with a higher voltage power supply, which may allow easier integration for some systems and may also improve system power efficiency.

According to some embodiments, a two stage MMIC amplifier includes a first stage transistor having a gate periphery less than about 1 mm and a second stage transistor having a gate periphery greater than about 1 mm. In particular, the MMIC amplifier may include a 0.72 mm first stage and a 1.2 mm second stage including AlGaN/GaN-based HEMT transistors with field plates. Typically, a transistor device employing a field plate would not be a good choice for a low noise amplifier, because the presence of the field plate may increase the input (gate to source) capacitance, which can increase the noise figure of the amplifier. However, it has been found that the presence of one or more field plates in the transistor can decrease other parasitics in the amplifier, which can improve the noise figure of the amplifier.

A GaN MMIC according to some embodiments may be matched at input and output to a 50 ohm impedance, and may have separate DC bias inputs for each stage.

Figure 1:
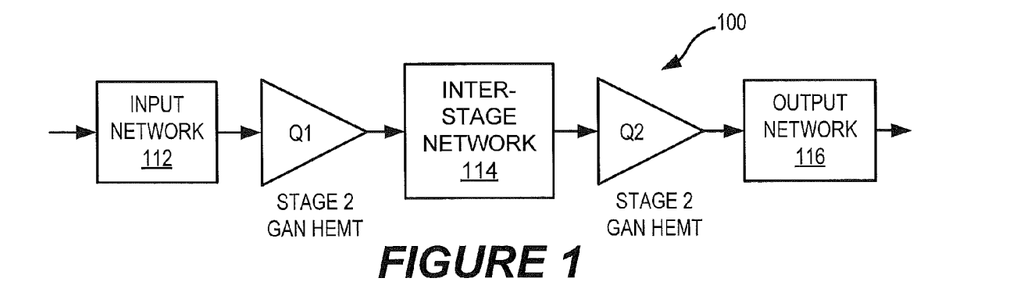
FIG. 1 is a block diagram of a GaN-based HEMT monolithic microwave integrated circuit low noise amplifier according to some embodiments.

FIG. 1 is a block diagram of a device according to some embodiments. As shown in FIG. 1, a monolithic microwave integrated circuit (MMIC) 100 includes an input network 112, a Stage 1 GaN-based HEMT Q1, an inter-stage network 112, a Stage 2 GaN-based HEMT Q2, and an output network 16.

Figure 2A:
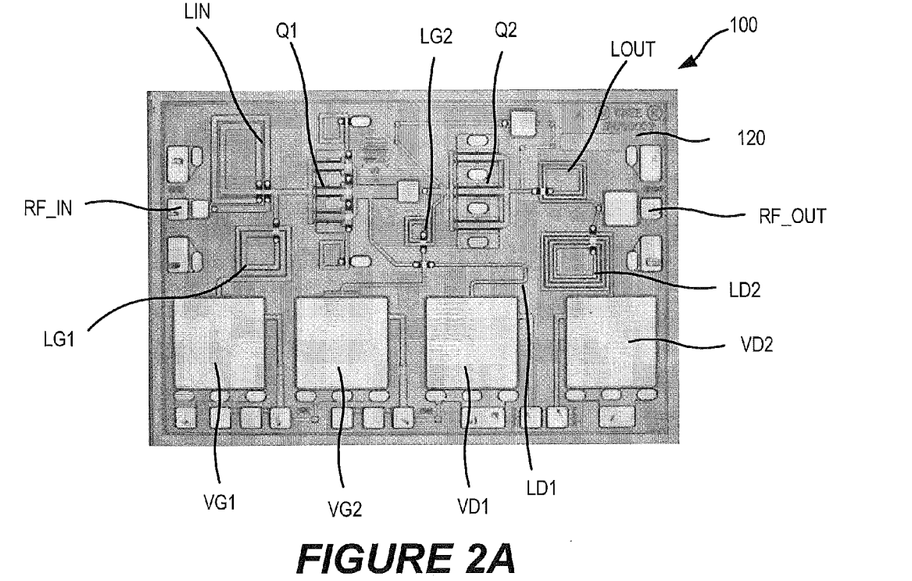
FIG. 2A illustrates a layout of a fabricated GaN-based HEMT low noise amplifier in accordance with some embodiments.
Figure 2B:
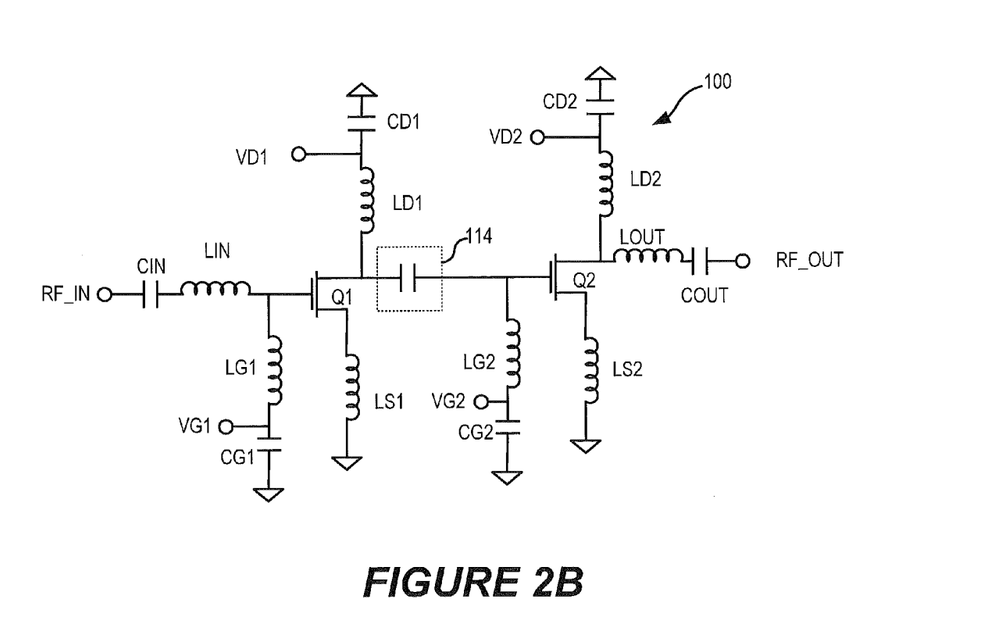
FIG. 2B is a circuit diagram of a GaN-based HEMT low noise amplifier in accordance with some embodiments.

FIG. 2A illustrates a layout of a fabricated GaN-based HEMT low noise amplifier 100 in accordance with some embodiments, and FIG. 2B is a circuit diagram of a GaN-based HEMT low noise amplifier 100 in accordance with some embodiments.

Referring to FIGS. 2A and 2B, a GaN-based MMIC 100 according to some embodiments includes a substrate 120, such as AlN, a metal core PCB, or the like, on which first and second GaN-based transistors Q1 and Q2 are provided. The first GaN-based transistor Q1 may have a gate periphery of 0.72 mm, while second GaN-based transistor Q1 may have a gate periphery of 1.2 mm. Both the first and second GaN-based transistors Q1, Q2 may be AlGaN/GaN-based HEMT transistors with field plates. In particular, the first GaN-based transistor Q1 may be a model G28V3 transistor and the second GaN-based transistor Q2 may be a model G28V3 transistor, both of which are manufactured by Cree, Inc., Durham, N.C., the assignee of the present invention.

Separate DC bias pads VG1, VG2, VD1 and VD2 are provided on the substrate 120 for the two transistors. DC blocking capacitors CG1, CD1, CG2 and CD2 isolate the DC bias pads VG1, VG2, VD1 and VD2 from ground, while RF choke inductors LG1, LD1, LG2, LD2 reduce RF noise from the DC inputs.

An RF signal input pad RF_IN receives an input RF signal to be amplified. The input signal is filtered by an input capacitor CIN and an input inductor LIN and is applied to the gate of the first transistor Q1. Drain bias is applied to the drain of the first transistor Q1 from the drain DC pad VD1, while gate bias is applied to the gate of the first transistor from the gate DC pad VG1. The source of the first transistor Q1 is coupled to ground through a source inductor LS1. An interstage network 14, which may include a capacitor, connects the drain of the first transistor Q1 to the gate of the second transistor Q2.

Drain bias is applied to the drain of the second transistor Q2 from the gate DC pad VD2, while gate bias is applied to the gate of the second transistor from the gate DC pad VG2. The source of the second transistor Q2 is coupled to ground through a source inductor LS2. The output of the second transistor Q2 is filtered by an output inductor LOUT and an output capacitor COUT and presented to the output terminal RF_OUT.

GaN HEMT structures that may be used in embodiments of the present invention are disclosed in the following publications, the contents of each of which are incorporated herein by reference as if fully set forth herein: U.S. Pat. No. 6,849,882, entitled "Group-III nitride based high electron mobility transistor (HEMT) with barrier/spacer layer," issued Feb. 1, 2005; U.S. Pat. No. 7,230,284, entitled "Insulating gate AlGaN/GaN HEMT," issued Jun. 12, 2007; U.S. Publication No. 2007/0059873, entitled "Fabrication of single or multiple gate field plates," published Mar. 15, 2007; U.S. Pat. No. 7,550,783, entitled "Wide bandgap HEMTs with source connected field plates," issued Jun. 23, 2009; U.S. Publication No. 2006/0202272, entitled "Wide bandgap transistors with gate-source field plates," published Sep. 14, 2006; U.S. Pat. No. 7,501,669, entitled "Wide bandgap transistor devices with field plates," issued Mar. 10, 2009; U.S. Pat. No. 7,126,426, entitled "Cascode amplifier structures including wide bandgap field effect transistor with field plates," issued Oct. 24, 2006; and U.S. Pat. No. 7,573,078 entitled "Wide bandgap transistors with multiple field plates," issued Aug. 11, 2009; U.S. Pat. No. 6,316,793, entitled "Nitride based transistors on semi-insulating silicon carbide substrates" issued Nov. 13, 2001, U.S. Pat. No. 6,586,781 entitled "Group III nitride based FETs and HEMTs with reduced trapping and method for producing the same" issued Jul. 1, 2003, U.S. Pat. No. 6,548,333 entitled "Aluminum gallium nitride/gallium nitride high electron mobility transistors having a gate contact on a gallium nitride based cap segment" issued Apr. 15, 2003; U.S. Publication No. 2002/0167023 entitled "Group-III nitride based high electron mobility transistor (HEMT) with barrier/spacer layer" published Nov. 14, 2002; and U.S. Publication No. 2003/00020092 entitled "Insulating gate AlGaN/GaN HEMT" published on Jan. 30, 2003.

FIGS. 3A to 3D illustrate Group III-nitride based HEMT structures including field plates that can be used in a low noise amplifier according to some embodiments.

Figure 3A:
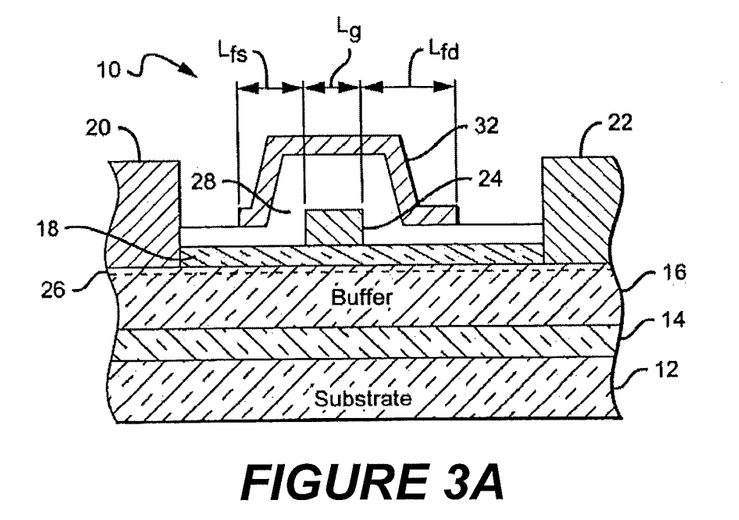
FIGS. 3A to 3D illustrate GaN-based HEMT structures including field plates that can be used in a low noise amplifier according to some embodiments.

Referring to FIG. 3A, a HEMT 10 includes a substrate 12 which can be made from silicon carbide, sapphire, spinel, ZnO, silicon, gallium nitride, aluminum nitride, or any other material or combinations of materials capable of supporting growth of a Group-III nitride material. A nucleation layer 14 can be formed on the substrate 12 to reduce the lattice mismatch between the substrate 12 and the next layer in the HEMT 10. The nucleation layer 14 may be approximately 1000 angstroms thick, although other thicknesses can be used. The nucleation layer 14 can include many different materials, with a suitable material being $Al_zGa_{1-z}N$ ($0 \leq z \leq 1$), and can be formed on the substrate 12 using known semiconductor growth techniques, such as Metal Organic Chemical Vapor Deposition (MOCVD), Hydride Vapor Phase Epitaxy (HVPE), or Molecular Beam Epitaxy (MBE).

The substrate 12 can be made of many different materials with a suitable substrate being a 4H polytype of silicon carbide, although other silicon carbide polytypes can also be used including 3C, 6H and 15R polytypes. Silicon carbide has a much closer crystal lattice match to Group III nitrides than sapphire, and may result in Group III nitride films of higher quality. Silicon carbide also has a very high thermal conductivity so that the total output power of Group III nitride devices on silicon carbide may not be limited by the thermal dissipation of the substrate (as may be the case with some devices formed on sapphire). Also, the availability of silicon carbide substrates may provide the capacity for device isolation and reduced parasitic capacitance that make commercial devices possible. Suitable SiC substrates are available from Cree, Inc., of Durham, N.C.

The formation of a nucleation layer 14 can depend on the material used for the substrate 12. For example, methods of forming a nucleation layer 14 on various substrates are taught in U.S. Pat. Nos. 5,290,393 and 5,686,738, each of which is incorporated by reference as if fully set forth herein. Methods of forming nucleation layers on silicon carbide substrates are disclosed in U.S. Pat. Nos. 5,393,993, 5,523,589, and 5,739,554 each of which is incorporated herein by reference as if fully set forth herein.

The HEMT 10 further includes a high resistivity buffer layer 16 formed on the nucleation layer 14. The buffer layer 16 can include doped or undoped layers of Group III-nitride materials with a suitable buffer layer 16 made of a Group III-nitride material, such as $Al_xGa_yIn_{1-x-y}N$ ($0 \leq x \leq 1$, $0 \leq y \leq 1$, $x+y \leq 1$). Other materials can also be used for the buffer layer 16 such as GaN that is approximately 2 microns (μm) thick, with part of the buffer layer doped with a deep level transition element, such as Fe.

A barrier layer 18 is formed on the buffer layer 16 with the buffer layer 16 being sandwiched between the barrier layer 18 and the nucleation layer 14. Like the buffer layer 16, the barrier layer 18 can include doped or undoped layers of Group III-nitride materials. The barrier layer can be made of one or multiple layers of $Al_xGa_{1-x}N$, where x ranges from 0 to 1, and x can be a function of depth such that the barrier layer 18 can be a graded layer. A two dimensional electron gas (2DEG) channel layer 26 is induced at the heterointerface between the buffer layer 16 and the barrier layer 18, with the buffer layer 16, 2DEG channel layer 26 and barrier layer 18 generally forming the HEMTs active region.

The buffer and barrier layers 16, 18 can be made using the same methods used to grow the nucleation layer 14. Electric isolation between the devices may be accomplished through mesa etch or ion implementation outside the active HEMT.

Metal source and drain electrodes 20, 22 are formed in contact with the barrier layer 18, and a gate 24 is formed on the barrier layer 18 between the source and drain electrodes 20, 22. Electric current can flow between the source and drain electrodes 20, 22 through the 2DEG channel layer 26 between the buffer layer 16 and the barrier layer 18 when the gate 24 is biased at the appropriate level. The formation of source and drain electrodes 20, 22 is described in detail in the patents and publications referenced above.

The source and drain electrodes 20, 22 can be made of different materials including but not limited to alloys of titanium, aluminum, gold or nickel. The gate 24 can also be made of different materials including but not limited to gold, nickel, platinum, titanium, chromium, alloys of titanium and tungsten, or platinum silicide. The gate 24 can have many different lengths ($L_g$), with a suitable gate length ranging from 0.1 to 2.0 microns (μm), although other gate lengths can also be used. In some embodiments, the gate length ($L_g$) may be approximately 0.5 microns (μm).

A first non-conducting spacer layer 28 is formed over the gate 24 and at least part of the surface of the barrier layer 18 between the gate 24 and the source and drain electrodes 20, 22. As shown in FIG. 3A, the spacer layer 28 covers all of the barrier layer 18 between the gate 24 and source and drain electrodes 22, 24. The spacer layer 28 can include a dielectric layer, or a combination of multiple dielectric layers. Different dielectric materials can be used such as a SiN, $SiO_2$, Si, Ge, $MgO_x$, $MgN_x$, ZnO, $SiN_x$, $SiO_x$, alloys or layer sequences thereof. The spacer layer can be many different thicknesses, with a suitable range of thicknesses being approximately 0.03 to 0.5 microns (μm).

A first field plate 32 is formed on the spacer layer 28 over the gate 24, with the first field plate extending on the spacer layer 28 a distance $L_{fd}$ toward the drain electrode 22 and extending a distance $L_{fs}$ toward the source electrode 20. The spacer layer 28 is arranged to provide isolation between the first field plate 32 and the barrier layer 18 and gate 24, so the spacer layer 28 need only cover the gate 18 and barrier layer 18 below the first field plate 32. For ease of manufacturing, however, the spacer layer typically covers the entire barrier layer 18. $L_{fd}$ can be different distances with a suitable range of distances being from 0.1 to 5 microns (μm). Similarly, $L_{fs}$ can be different distances with a suitable range of distances being 0.1 to 2 microns. In other embodiments, the field plates may not be continuous, but can have holes or interruptions as desired.

The field plate 32 can include many different conductive materials with a suitable material being a metal deposited using standard metallization methods. In one embodiment according to the present invention the field plate 30 includes the same metal as the feature that it is electrically connected to as described below.

The first field plate 32 can be electrically connected to either the source electrode 20 or the gate 24. For example, the first field plate 32 can be electrically connected to the source electrode 20 through a conductive path (not shown) that runs outside of the active region of the HEMT 10 and is connected to the source electrode 20.

Figure 3B:
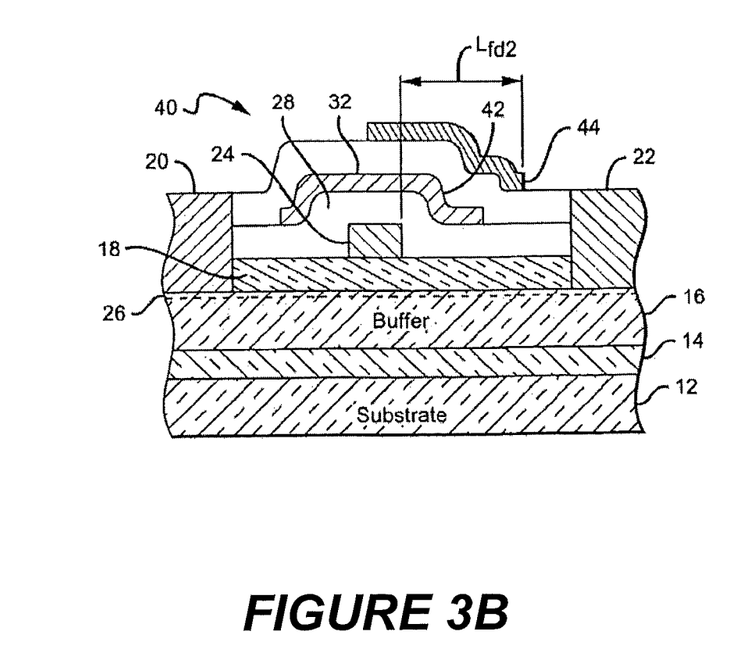

FIG. 3B shows the HEMT 40 that is similar to the HEMT 10 of FIG. 3A, but also includes a second non-conducting spacer layer 42 that is formed over at least a portion of the first field plate 32, with a second spacer layer 42 as shown covering the first field plate and the exposed surface of the first spacer layer 28. The second spacer layer 42 can be formed of the same material or layers of material as the first spacer layer 28 and can have a total thickness in the range of 0.05 to 2 microns (μm).

A second field plate 44 can then be deposited on the second spacer layer 42. Different second field plates according to the present invention can provide different coverage, with, the second field plate 44 as shown overlapping the gate 24. Other second field plates according to the present invention can have a space between the edge of the gate 24 and the starting edge of the second field plate. Another portion of the second field plate 44 extends from the edge of gate 24 toward the drain contact 22 a distance $L_{fd2}$, which can be in the range of 0.2 to 5 microns. In those embodiments where the second spacer layer 42 covers less than all of the first field plate 32 and spacer layer 28, the second spacer layer 42 must cover enough of the first field plate 32 to provide electrical isolation between the first and second field plates 32, 44.

The second field plate 44 can be connected to the source electrode 20 or the gate 24 and many different connecting structures can be used, as described in more detail in the above-referenced U.S. Publication No. 2006/0202272.

After deposition of the second field plate 44 and its connection to the source electrode 20, the active structure can be covered by a dielectric passivation layer (not shown), such as silicon nitride. Methods of forming the dielectric passivation layer are described in detail in the patents and publications referenced above. The HEMT 10 in FIG. 3A can also be covered by a dielectric passivation layer after formation of the spacer layer(s) and field plates(s).

Figure 3C:
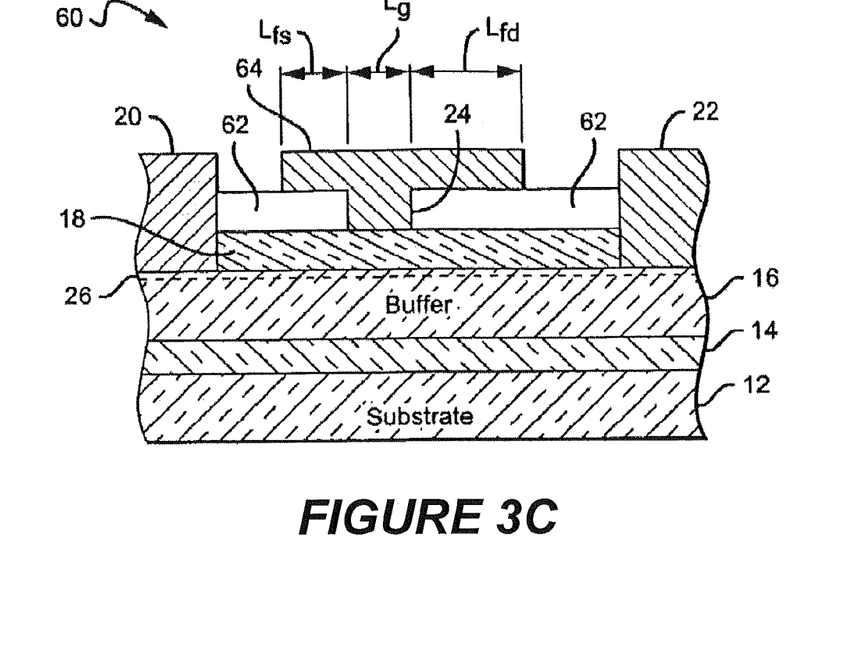

FIG. 3C shows another embodiment of a HEMT 60 according to the present invention having many features that are similar to those in HEMT 10, and for those similar features the same reference numbers are used. HEMT 60 includes a substrate 12, nucleation layer 14, buffer layer 16, barrier layer 18, source electrode 20, drain electrode 22, gate 24 and 2DEG 26 channel layer. Like above, the gate 24 has a width $L_g$ ranging from 0.1 to 5 microns (μm).

The HEMT 60, however, includes a spacer layer 62 that does not cover the gate 24, but instead covers the barrier layer 18 between the gate 24 and the source and drain contacts 20, 22. In other embodiments, the spacer layer can cover less than the entire surface of the barrier layer 18, as described above. The coverage should be enough to provide electric isolation between the first field plate 64 and the barrier layer 18. The first field plate 64 is formed integral to the gate 24 and extends on the spacer layer 62 a distance $L_{fd}$ in the range of 0.2 to 5 microns (μm) toward the drain contact 22, and a distance $L_{fs}$ in the range of 0.1 to 2 microns (μm) toward the source contact 20. For the HEMT 60 the first field plate is electrically connected to the gate 24 by its integral formation with the gate 24. The field plate 62 can be fully integral with the gate or can have breaks of holes in its integral connection on either the source or drain side of the contact, or both, as long as enough conductive paths are available to effectively spread current between the gate 24 and field plate 64.

In HEMT 60 the first spacer layer 62 can be formed before device metallization and in those instances the spacer layer can include an epitaxial material such as a Group III nitride material having different Group III elements such as alloys of Al, Ga, or In, with a suitable spacer layer material being $Al_xGa_{1-x}N(0 \leq x \leq 1)$. After epitaxial growth of the barrier layer 18, the first spacer layer 62 can be grown using the same epitaxial growth method. The first spacer layer 62 is then etched to provide an opening for the gate 24, source electrode 20 and drain electrode 22. During metallization the gate 24 is formed in electrical contact with the barrier layer 18 and the first field plate 64 is formed integral to the gate and extending on the spacer layer 62. The source and drain electrodes 20, 22 can be formed during this same metallization step.

In other embodiments the gate 24 can be first metallized on the active region and the spacer layer can be formed of a dielectric material on the active region between the gate 24 and source and drain contacts 20, 22. The field plate 64 can then be formed integral to the gate 24. By having the field plate 64 extend toward both the source electrode 20 and the gate electrode 22, the HEMT 60 may experience the same operating benefits as the HEMT 10 in FIG. 3A.

Figure 3D:
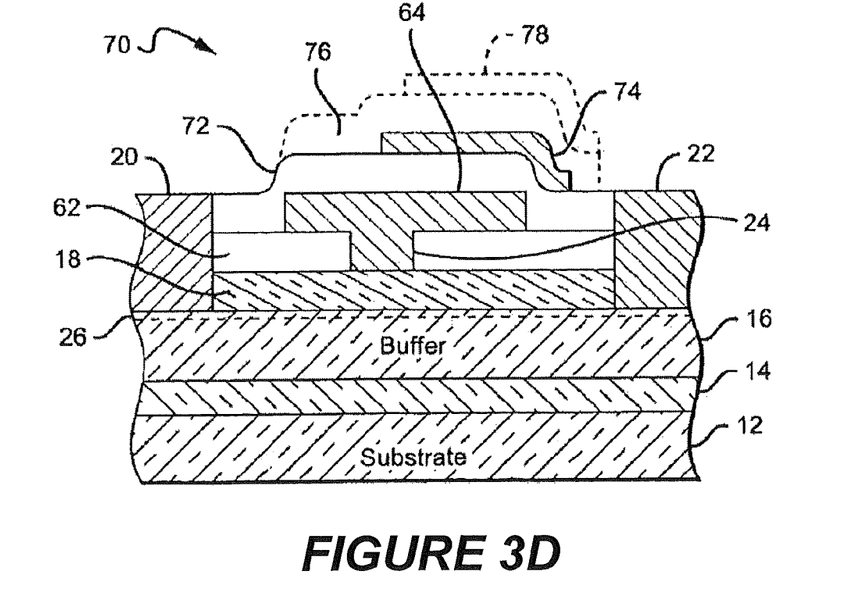

FIG. 3D shows another embodiment of a HEMT 70 that is similar to the HEMT 60 shown in FIG. 3C and has a substrate 12, nucleation layer 14, buffer layer 16, barrier layer 18, source electrode 20, drain electrode 22, gate 24, 2DEG channel layer 26, first spacer layer 62 and first field plate 64. The HEMT 70, however, also has a second dielectric spacer layer 72 and a second field plate 74, with the second spacer layer covering enough of the first field plate 64 to provide electric isolation between the first and second field plates 64, 74. As shown, the spacer layer covers the first field plate 64 and the exposed surfaces of the first spacer layer 62. The second field plate 74 can be electrically connected to the source contact 20 or the gate using different methods, including the conductive paths described above that run outside the HEMT's active region.

The HEMTs 40 and 70 can also include additional spacer layer and field plate pairs over the second field plate 72 and second spacer layer 74. FIG. 3D shows an additional pair on the HEMT 70 including a third spacer layer 76 (in phantom) and a third field plate 78 (in phantom), with the spacer layer 76 covering enough of the second field plate 74 to provide electric isolation between the second and third field plates 74, 76. The third field plate 78 (and any subsequent field plates) can also be electrically coupled to the source electrode or gate.

In some embodiments, the top field plate is connected to the source electrode while the intermediate field plates below can be connected to the source electrode or the gate. For example, a transistor according to the present invention can have three field plates, with the top one connected to the source electrode and the ones below connected to either the source electrode or the gate.

A multiple field plate arrangement can further reduce the peak electric field in the device, resulting in increased breakdown voltage and reduced trapping. This can improve gain and stability that can be negatively impacted by gate connected field plates. When arranged as shown herein, the shielding effect of a source-connected field plate can reduce the gate-drain capacitance $C_{gd}$, which may enhance input-output isolation.

Figure 4:
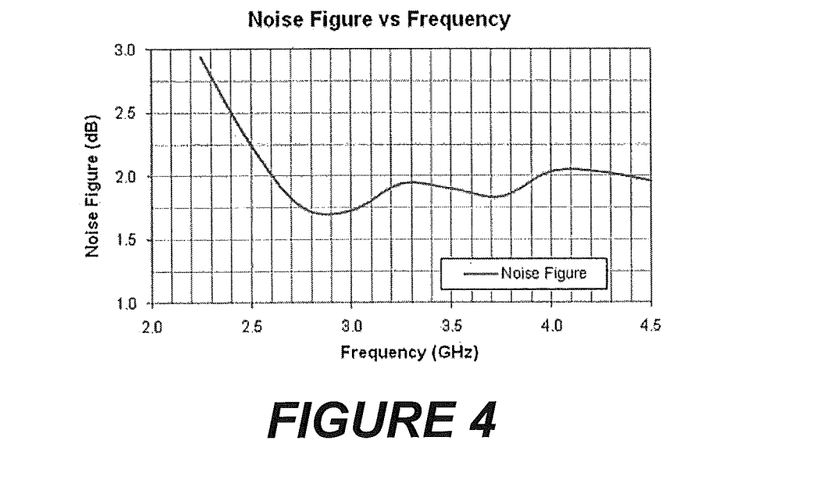
FIG. 4 is a graph illustrating a Noise Figure of a fabricated low noise amplifier in accordance with some embodiments.

FIG. 4 is a graph illustrating a Noise Figure of a fabricated low noise amplifier in accordance with some embodiments. FIG. 3 illustrates that a GaN based low noise amplifier in accordance with some embodiments may have a noise figure less than 2.0 dB over a wide frequency range of 2.6 GHz to 3.95 GHz.

Figure 5:
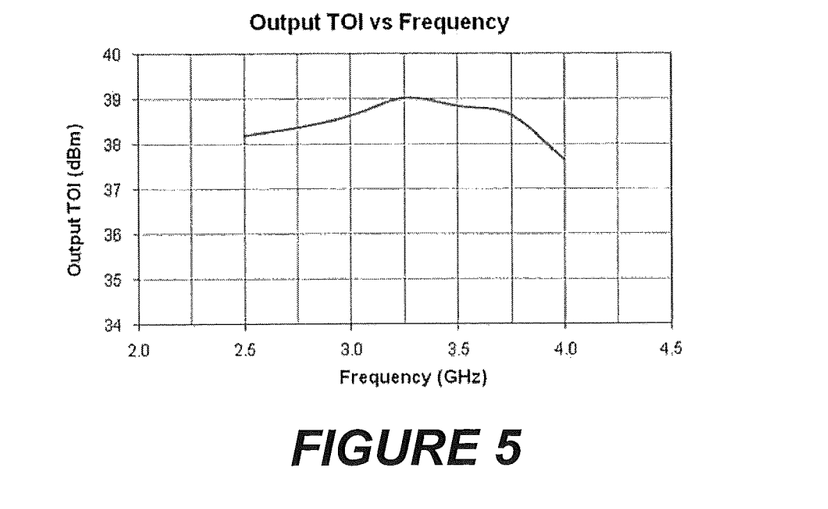
FIG. 5 is a graph illustrating Output Third Order Intercept of a fabricated low noise amplifier in accordance with some embodiments.
Figure 6:
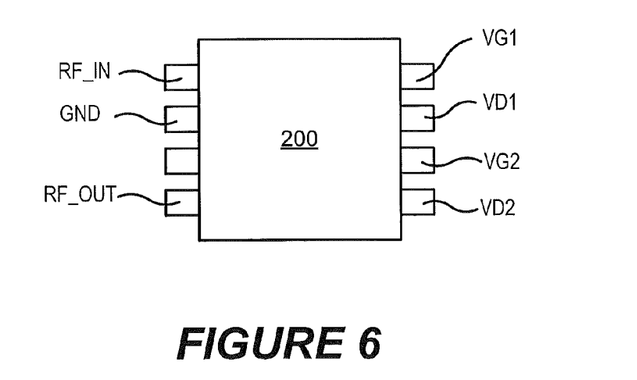
FIG. 6 illustrates a packaged device in accordance with some embodiments.

FIG. 5 is a graph illustrating Output Third Order Intercept (TOI) of a fabricated low noise amplifier in accordance with some embodiments. Third order intercept is a measure of the linearity of a device. In general, the higher the TOI, the wider the range of linear operation of the device. FIG. 4 illustrates that a GaN-based MMIC in accordance with some embodiments may have a TOI greater than 37.5 dBm over a wide frequency range of 2.6 GHz to 3.95 GHz.

Conventional low noise amplifiers that employ non-GaN based transistors may have unacceptably high noise figures and/or low third order intercepts (TOI). In contrast, a MMIC according to some embodiments may achieve a low noise figure (e.g., less than 2.0 dB) in conjunction with high TOI (e.g., greater than 37.5 dBm).

In some embodiments, a MMIC according to some embodiments may have a noise figure less than 2.0 dB at a frequency that is in the range of 2.6 GHz to 3.95 GHz. In further embodiments, a MMIC according to some embodiments may have a noise figure less than 2.5 dB at a frequency that is in the range of 2.6 GHz to 3.95 GHz. In still further embodiments, a MMIC according to some embodiments may have a noise figure less than 3.0 dB at a frequency that is in the range of 2.6 GHz to 3.95 GHz.

The TOI of a device according to some embodiments may be about 10-15 dBm higher than a comparable device fabricated using GaAs-based transistors. Accordingly, in some embodiments, a MMIC according to some embodiments may have a third order intercept of at least 37.5 dBm at a frequency that is in the range of 2.6 GHz to 3.95 GHz. In further embodiments, a MMIC according to some embodiments may have a third order intercept of at least 30 dBm at a frequency that is in the range of 2.6 GHz to 3.95 GHz. In further embodiments, a MMIC according to some embodiments may have a third order intercept of at least 25 dBm at a frequency that is in the range of 2.6 GHz to 3.95 GHz.

Other embodiments of this invention include the use of GaN wide bandgap transistors that employ, but are not limited to, other heteroepitaxial channel and/or barrier layers such as aluminum nitride barriers, indium gallium nitride channels or other epitaxy/device structures, such as the structures illustrated in the patents and applications listed above.

In addition to/instead of GaN field plated HEMTs, some embodiments may employ, but are not limited to, GaN-based HEMTs without field plate or GaN-based MESFETs (with or without field plates) as the active device.

Some embodiments provide a low noise amplifier may have an operating frequency range of 10 MHz to 6 GHz with a saturated output power of greater than 25 watts continuous wave (CW) and a power gain of at least 12 dB. The amplifier may have a drain efficiency of at least 40%. The amplifier may have a third order intercept greater than 25 dBm at a frequency that is in the range of 2.6 GHz to 3.95 GHz. Moreover, the amplifier may have a noise figure less than 3.0 dB at a frequency that is in the range of 2.6 GHz to 3.95 GHz.

Applications of circuits/devices according to some embodiments include any S-band RF module or receiver. The primary systems where a GaN HEMT LNA may be used are in base stations for cellular communications including derivative applications (e.g. 3G, 4G, WiFi, WiMax, and digital broadcast receivers) and receivers and modules for radar applications. The improvement in the dynamic range of the devices according to some embodiments may lead to significant improvement in the performance of such systems.

An LNA according to some embodiments may be advantageously employed, for example, in receiver front ends for communications, radar, and other RF systems requiring Low Noise Amplification of RF signals in the 2.5 GHz to 4 GHz band in conjunction with high linearity, high input power survivability, and/or integration with into a high voltage system.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A monolithic microwave integrated circuit comprising:
   a substrate; and
   a low noise amplifier on the substrate and comprising:
   an input port on the substrate for receiving an input signal to be amplified;
   a first Group III-nitride based transistor on the substrate and having a gate coupled to the input port, wherein the first Group III-nitride based transistor is configured to provide a first stage of amplification to the input signal;
   a second Group III-nitride based transistor on the substrate and having a gate coupled to a drain of the first Group III-nitride based transistor, wherein the second Group III-nitride based transistor is configured to provide a second stage of amplification to the input signal; and
   an output port on the substrate and coupled to a drain of the second Group III-nitride based transistor, wherein at least one of the first and second Group III-nitride based transistors comprises at least two field plates.

2. The monolithic microwave integrated circuit of claim 1, wherein the first and second Group III-nitride based transistors comprise Group III-nitride based high electron mobility transistors.

3. A monolithic microwave integrated circuit amplifier comprising:
   a substrate;
   an input port on the substrate for receiving an input signal to be amplified;
   a first Group III-nitride based transistor on the substrate and having a gate coupled to the input port, wherein the first Group III-nitride based transistor is configured to provide a first stage of amplification to the input signal;
   a second Group III-nitride based transistor on the substrate and having a gate coupled to a drain of the first Group III-nitride based transistor, wherein the second Group III-nitride based transistor is configured to provide a second stage of amplification to the input signal; and
   an output port on the substrate and coupled to a drain of the second Group III-nitride based transistor, wherein at least one of the first and second Group III-nitride based transistors comprises a field plate conductively connected to a source terminal of the at least one transistor.

4. The monolithic microwave integrated circuit amplifier of claim 3, wherein the field plate comprises a first field plate, the at least one transistor further comprising a second field plate that is electrically isolated from the first field plate.

5. The monolithic microwave integrated circuit amplifier of claim 4, wherein the second field plate is conductively connected to a source terminal of the at least one transistor.

6. The monolithic microwave integrated circuit of claim 1, further comprising an input network coupled between the input port and the first Group III-nitride based transistor, an interstage network coupled between the first Group III-nitride based transistor and the second Group III-nitride based transistor, and an output network coupled between the second Group III-nitride based transistor and the output port.

7. The monolithic microwave integrated circuit of claim 1, further comprising a first gate bias port coupled to a gate of the first Group III-nitride based transistor, a first drain bias port coupled to a drain of the first Group III-nitride based transistor, a second gate bias port coupled to a gate of the second Group III-nitride based transistor, and a second drain bias port coupled to a drain of the second Group III-nitride based transistor.

8. The monolithic microwave integrated circuit of claim 1, wherein the first Group III-nitride transistor has a gate periphery less than about 1 mm, and the second Group III-nitride transistor has a gate periphery greater than about 1 mm.

9. The monolithic microwave integrated circuit of claim 8, wherein the first Group III-nitride transistor has a gate periphery of about 0.72 mm, and the second Group III-nitride transistor has a gate periphery of about 1.2 mm.

10. A package comprising a monolithic microwave integrated circuit as recited in claim 1, wherein the package has a footprint not greater than 0.5 inches square.

11. The monolithic microwave integrated circuit of claim 1 configured to provide a third order intercept greater than 25 dBm at a frequency that is in the range of 2.6 GHz to 3.95 GHz.

12. The monolithic microwave integrated circuit of claim 1 configured to provide a noise figure less than 3.0 dB at a frequency that is in the range of 2.6 GHz to 3.95 GHz.

13. The monolithic microwave integrated circuit of claim 1, wherein at least one of the at least two field plates is conductively connected to a source terminal of the at least one transistor.

14. The monolithic microwave integrated circuit of claim 1, wherein at least one of the at least two field plates is conductively connected to a gate terminal of the at least one transistor.

15. The monolithic microwave integrated circuit of claim 1, wherein the at least two field plates comprise a first field plate and a second field plate that is electrically isolated from the first field plate.

16. The monolithic microwave integrated circuit of claim 15, wherein the second field plate is conductively connected to a source terminal of the at least one transistor.

17. The monolithic microwave integrated circuit amplifier of claim 3, configured to operate as a low noise amplifier.

18. The monolithic microwave integrated circuit of claim 1, wherein at least one of the at least two field plates is integral with the gate of the at least one of the first and second Group III-nitride based transistors.

19. The monolithic microwave integrated circuit of claim 4, wherein at least one of the first and second field plates is integral with the gate of the at least one of the first and second Group III-nitride based transistors.

* * * * *